(12) United States Patent
Mayer et al.

(10) Patent No.: US 10,455,741 B2
(45) Date of Patent: Oct. 22, 2019

(54) RACK ENCLOSURE WITH PERFORATIONS FOR COOLING

(71) Applicant: Hewlett Packard Enterprise Development LP, Houston, TX (US)

(72) Inventors: Dave Mayer, Fort Collins, CO (US); Arlen L. Roesner, Fort Collins, CO (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/564,826

(22) PCT Filed: Apr. 17, 2015

(86) PCT No.: PCT/US2015/026465
§ 371 (c)(1),
(2) Date: Oct. 6, 2017

(87) PCT Pub. No.: WO2016/167804
PCT Pub. Date: Oct. 20, 2016

(65) Prior Publication Data
US 2018/0110154 A1    Apr. 19, 2018

(51) Int. Cl.
*H05K 7/20* (2006.01)
*H05K 7/14* (2006.01)

(52) U.S. Cl.
CPC ..... *H05K 7/20572* (2013.01); *H05K 7/20145* (2013.01); *H05K 7/20736* (2013.01); *H05K 7/1488* (2013.01)

(58) Field of Classification Search
CPC .......... H05K 7/20736; H05K 7/20145; H05K 7/20554–20572; H05K 7/20718–20736; G06F 1/20

USPC ........ 361/679.49–679.51, 724–727; 454/184
See application file for complete search history.

(56) References Cited

U.S. PATENT DOCUMENTS

| 7,957,139 B2 | 6/2011 | Davis |
| 8,085,554 B2 | 12/2011 | Holdredge |
(Continued)

FOREIGN PATENT DOCUMENTS

| CN | 100488346 | 9/2007 |
| JP | 2006140343 | 6/2006 |
(Continued)

OTHER PUBLICATIONS

Data Centre Products; "Eaton RP Series IT Racks"; Feb. 1, 2013, 16 pages.

*Primary Examiner* — Dion Ferguson
*Assistant Examiner* — Amir A Jalali
(74) *Attorney, Agent, or Firm* — Hewlett Packard Enterprise Patent Department

(57) ABSTRACT

The present examples include a rack enclosure with perforations formed within vertical rack columns. Front vertical rack columns may include front perforations formed therein. The front perforations may draw air into the rack enclosure and further into a chassis. Side plenums along the side surface of the chassis may consume less space with the use of the front perforations. The space not consumed by the side plenums may be available to accommodate a chassis of a substantial volume. The chassis may expand a substantial width of the rack enclosure to house an enlarged or a maximum number of computing components within the rack enclosure.

8 Claims, 6 Drawing Sheets

(56) References Cited

U.S. PATENT DOCUMENTS

| | | | |
|---|---|---|---|
| 8,199,486 B2 | 6/2012 | Chen | |
| 8,842,431 B2 | 9/2014 | Byers | |
| 2002/0020682 A1* | 2/2002 | Broome | H05K 7/186 211/26 |
| 2004/0182799 A1* | 9/2004 | Tachibana | H05K 7/20572 211/26 |
| 2004/0257766 A1* | 12/2004 | Rasmussen | H05K 7/20572 361/689 |
| 2006/0276121 A1 | 12/2006 | Rasmussen | |
| 2008/0257639 A1* | 10/2008 | Yamaguchi | H05K 7/20736 181/198 |
| 2008/0266789 A1* | 10/2008 | Hruby | H05K 7/20572 361/692 |
| 2009/0122484 A1* | 5/2009 | Caveney | H05K 7/20572 361/692 |
| 2009/0227197 A1* | 9/2009 | Lewis, II | H05K 7/20736 454/284 |
| 2010/0110633 A1* | 5/2010 | Gigushinsky | H05K 7/20736 361/695 |
| 2010/0139887 A1* | 6/2010 | Slessman | F28F 9/0265 165/67 |
| 2012/0134108 A1* | 5/2012 | Brouillard | H05K 7/20645 361/679.49 |
| 2012/0162904 A1* | 6/2012 | Chan | G06F 1/181 361/679.48 |
| 2012/0293951 A1* | 11/2012 | Jai | H05K 7/20727 361/679.53 |
| 2014/0071621 A1* | 3/2014 | Dong | H05K 7/20727 361/692 |
| 2014/0177164 A1 | 6/2014 | Stewart | |
| 2015/0173253 A1* | 6/2015 | Lewis, II | H05K 5/0004 312/223.2 |

FOREIGN PATENT DOCUMENTS

| | | |
|---|---|---|
| JP | 2010067628 A* | 3/2010 |
| KR | 200446915 | 12/2009 |

\* cited by examiner

RACK ENCLOSURE WITH PERFORATIONS FOR COOLING

BACKGROUND

Computing centers often contain large numbers of computing components. For example, the computing components may include servers, modems, routers, and other equipment, such as power, coding, and cable management resources, among others. A rack enclosure may provide a standardized structure to support and mount the computing components inside of the rack enclosure.

The computing components often generate a substantial amount of heat while mounted within the rack enclosure, in particular, any component that uses power will generate heat, as it is an unavoidable by-product. However, various heat removal techniques may dissipate the heat in order to improve reliability and prevent premature failure of the computing components. Thermal management is one type of heat removal technique used to dissipate heat away from the point of generation. The thermal management technique may include the use of cooling air, fans, or specialized materials, among ethers, for heat removal. For example, the cooling air may be limited by flowing within a chassis to cool the computing components. In particular, the heat removal technique is merely limited to the width of the chassis to flow the cooling air.

BRIEF DESCRIPTION OF THE DRAWINGS

The advantages of the present examples are better understood by referring to the following detailed description and the attached drawings, in which.

DETAILED DESCRIPTION OF SPECIFIC EXAMPLES

Figure 1A:
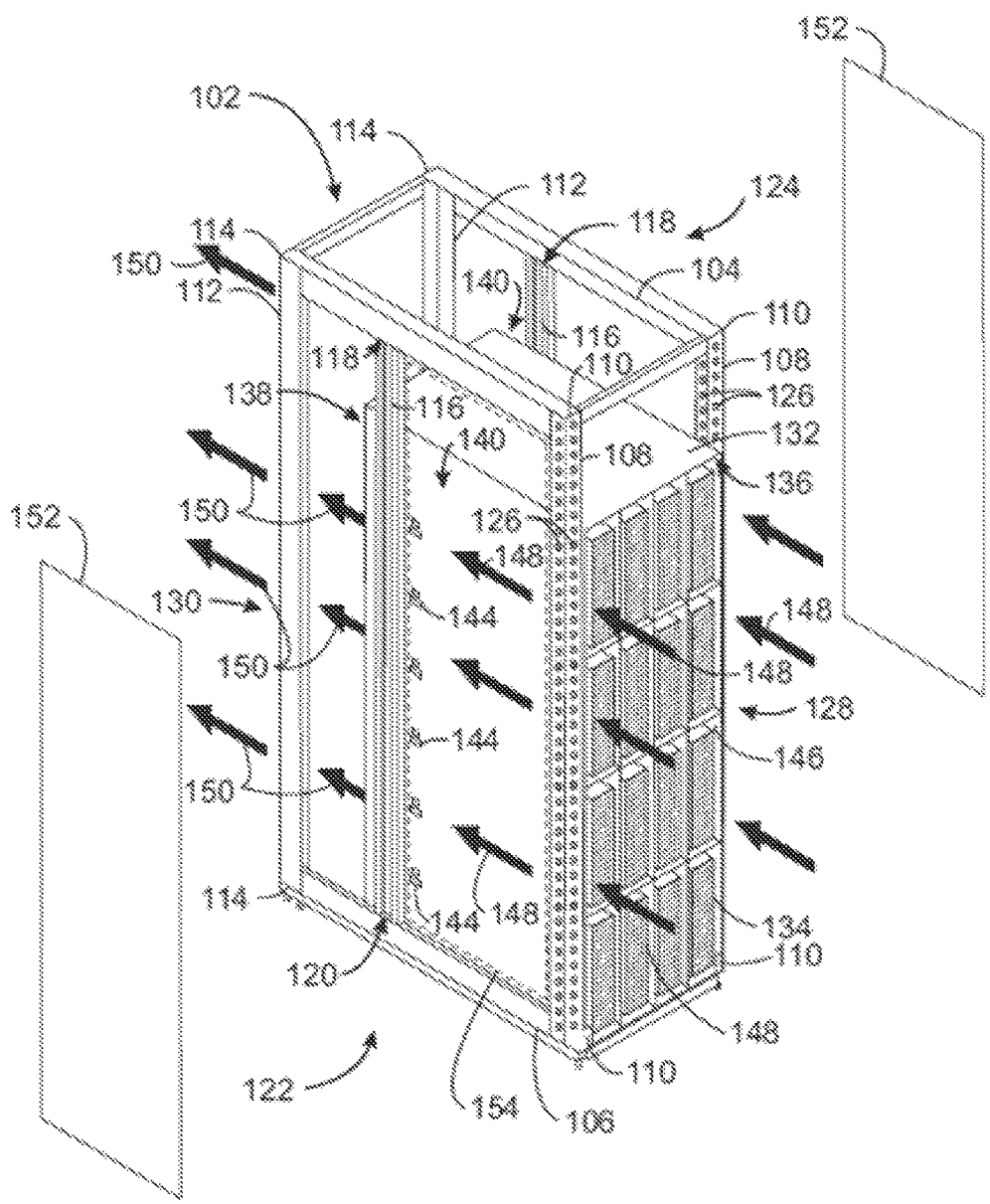
FIG. 1A is a perspective view of an example of a rack.

A rack is a frame used to mount various computing components such as servers, modems, routers, and other computing components. The rack may include rack columns located at the four corners of the rack where openings may separate the rack columns. The insertion of side panels in the openings between the rack columns may convert the rack into a rack enclosure.

As described herein, a structure used to house the computing components may include a product, for example, a chassis. The chassis, along with the computing components housed therein, may be mounted in the rack enclosure. In other examples, the computing components may be mounted in the rack enclosure without the use of the chassis. For example, the rack enclosure may include a rack-mount server, a rack-mount modem, or the like. During normal computing operations, the computing components may generate a substantial amount of heat that may cause damage. Thus, proper cooling and ventilation techniques may cool the computing components and maintain the temperature within the chassis.

A plenum, e.g., an air plenum, is a volumetric space used to provide pathways where air flows through the pathways. Within a rack enclosure, the space between a rack panel and a wall of an installed chassis may form side plenums located along side surfaces of the chassis. Air may enter the rack enclosure at front air intakes located in front corner rack columns to flow into the side plenums. In this way, the side plenums may provide an auxiliary pathway for the air to flow along the side surfaces of the chassis and into the chassis. For example, the side plenums may provide a pathway for cooling air to flow into the chassis to cool computing components located therein. Typically, the side plenums are not used in a rack enclosure since corner rack columns prevent frontal access to the rack and where the chassis remains within the inner confines of the rack enclosure width. However, by using the side plenums within the rack enclosure as a pathway for air, the size and the number of the computing components can be maximized. In particular, the open space along the side surfaces of the chassis may be used to flow the cooling air instead of using space inside of the chassis to flow the cooling air.

Examples described herein provide techniques to maximize spacing in a rack enclosure to mount computing components. In particular, the rack enclosure may include front perforations in front rack columns to allow air to enter side plenums. The air may flow through the side plenums to be directed into the chassis, for example, through openings along the sides of the chassis. The use of the front perforations may reduce the space needed in comparison to side plenums in the chassis that have air intakes with a substantial width. In this way, the rack enclosure may be considered a part of a thermal cooling solution. In the present examples, the width of the side plenums in the chassis may be reduced to provide additional space for other uses. As a result, the chassis may occupy a substantial width within the rack enclosure to house enlarged or a maximum number of computing components stored within for increased functionality.

FIG. 1A is a perspective view of an example of a rack 102. The rack 102 may include an upper frame 104 and a lower frame 106 substantially parallel to the upper frame 104. The rack 102 may include four vertical rack columns. Two front vertical rack columns 108 may connect to the upper frame 104 and to the lower frame 106 at front corners 110. Two rear vertical rack columns 112 may connect to the upper frame 104 and to the lower frame 106 at rear corners 114. The two front vertical rack columns 108 and the two rear vertical rack columns 112 may be parallel to each other and substantially perpendicular to the upper frame 104 and the lower frame 106. The term 'substantially' is defined as being largely but not wholly of that which is specified. Middle vertical rack columns, for example, side barriers 116 may extend from a mid-way point 118 of the upper frame 104 to a mid-way point 120 of the lower frame 106. The side barriers 116 may be located on a first side 122 of the rack 102 and a second side 124 of the rack 102. The number of side barriers 116 may vary depending on manufacturing specifications. The term "vertical," as used herein, may refer to a directional orientation that extends in a plane substantially perpendicular to a reference surface, such as the upper frame 104 and the lower frame 106.

Each of the front vertical rack columns 108 may include a number of perforations. The two front vertical rack columns 108 at a front side 128 of the rack 102 may include front perforations 126 formed along the vertical length of the columns 108.

A chassis 132 may be mounted in the rack 102 to house various computing components 134. The chassis 132 may be a four-sided structure including a front surface 136, a rear surface 136, and side surfaces 140. The chassis 132 may include side openings 144 located at the side surfaces 140 for the intake of air. The chassis 132 may have a square shape, a rectangle shape or any shape that the rack 102 can accommodate. The chassis 132 may include slots 146 used to house and access the various computing components 134. The chassis 132 may be mounted in the rack 102 using rails, brackets, and other securing equipment. As previously discussed, other examples may directly mount the computing comments 134 within the rack 102.

The computing components 134 located in the slots 146 may be heat-generating computing components. However, to maintain reliability and prevent equipment failure, the chassis 132 may use a cooling system to maintain its temperature. The cooling system may control the temperature of the chassis 132 by dissipating the heat generated by the computing components using ambient temperature air. For example, the chassis 132 may include at least one or more internal fans to draw ambient temperature air into the chassis 132. As herein described, the ambient temperature air is referred to as cooling air 148.

As described herein, the rack 102 may be designed for front-to-back cooling. The front-to-back cooling technique moves the cooling air 148 from the front side 128 of the rack 102 to the rear side 130 of the rack 102. In other examples, the rack 102 may be designed for other types of flow patterns, such as a side-to-side cooling technique where cooling air 148 may enter and exit the rack 102 in a direction perpendicular to the front-to-back airflow, for example, a right-to-left airflow or a left-to-right airflow.

The rack 102 may include rack panels 152 installed between one of the front vertical rack columns 108 and one of the rear vertical rack columns 114, on the first side 122 and the second side 124 of the rack 102. The rack panels 152 will be further discussed with respect to FIG. 1B. A side plenum 154, as shown by the dashed lines, may be created with the mounting of the rack panels 152. In particular, the side plenums 154 may include the space located between one of the rack panels 152 and one of the side surfaces 140 of chassis 132. The side plenums 154 may be located on the first side 122 and the second side 124 of the rack 102

The chassis 132 may include an internal fan to pull the cooling air 148 from an external environment through the front perforations 126 into the side plenums 154. The side plenums 154 may direct the cooling air 148 into the chassis 132 at the side openings 144 to cool the computing components 134. For example, the side plenums 154 may provide an air pathway to route the cooling air 148 as it flows along the side surfaces 140, into the side openings 144, and over the computing components 134. The number of side openings 144 may vary depending on the number of computing components 134 located in the chassis 132. The cooling air 148 may remove heat generated by the computing components 134 and form a heated air 150. In this way, the environment of the chassis 132 may be cooled to a temperature to reduce or alleviate damage to the computing components 134. The heated air 150 may exit out of the rear side 130 of the rack 102, including any rear doors paced on the rack 102.

A filler material, for example, a foam gasket material may seal the side barriers 116 to the chassis 132. The side barriers 116 may direct the cooling air 148 into the side openings 144. For example, the side barriers 116 may prevent the coding air 148 from flowing pass the side openings 144 and into the rear side 130 of the rack 102. Without the side barriers 116, the heated air 150 that exits the rear surface 138 may be suctioned in a backward direction and into the side openings 144 of the chassis 132. In this case, the heated air 150 may mix with the cooling air 148 that flows into the side openings 144, thus, increasing the temperature of the cooling air 148 to form a warm air. The warm air may flow into the side openings 144 and may lessen the effect of the cooling air 148 to dissipate the heat within the chassis 132. Accordingly, the side barriers 116 may block the heated air 150 from entering the side openings 144 and may divert the cooling air 148 into the chassis 132 and not into the rear side 130 of the rack 102.

Figure 1B:
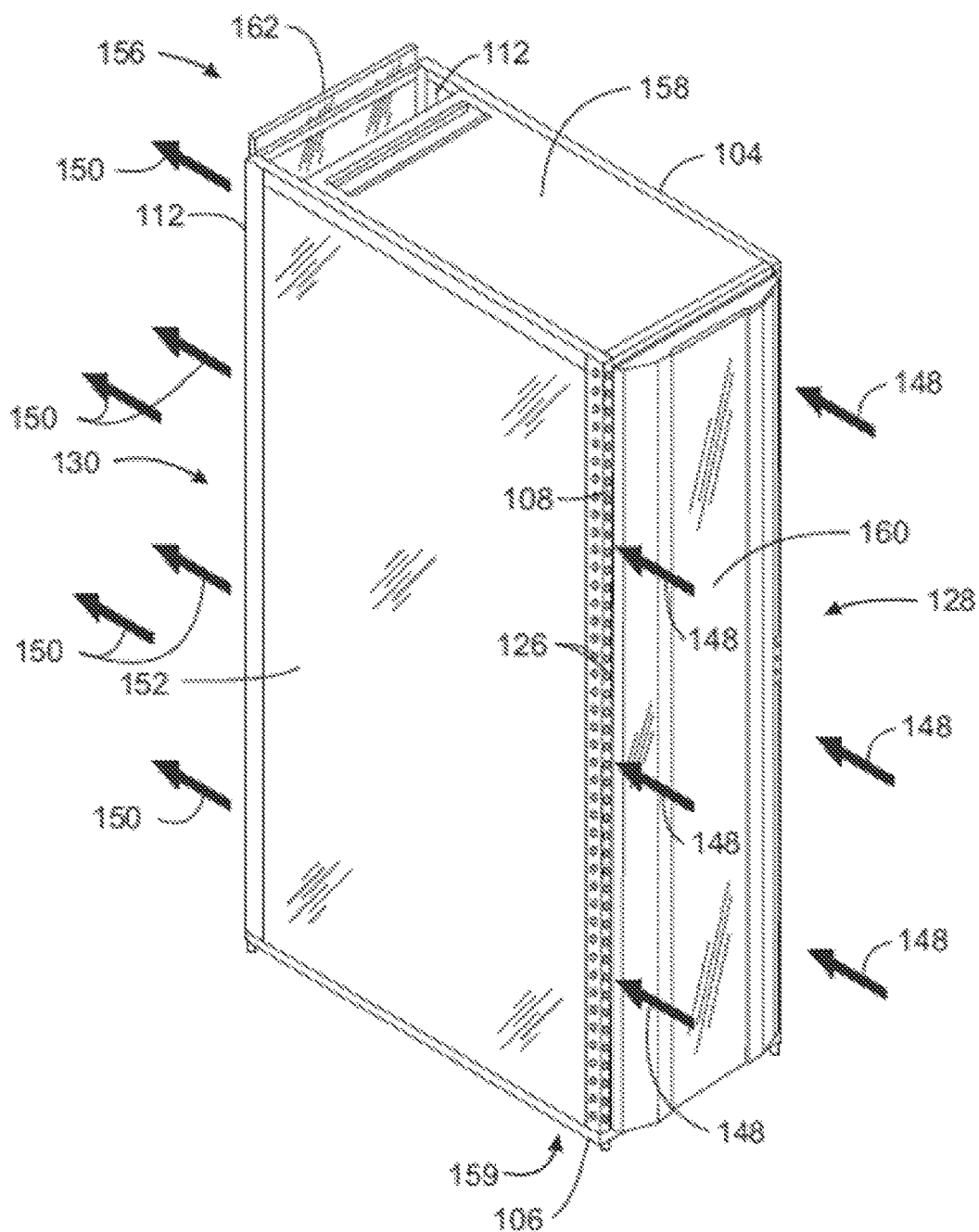
FIG. 1B is a perspective view of an example of the rack including rack panels to form a rack enclosure.

FIG. 1B is a perspective view of an example of the rack 102 including rack panels 152 to form a rack enclosure 156. The installation of the rack panels 152 forms the rack enclosure 156. The rack panels 152 may be installed between one or the front vertical rack columns 108 and one of the rear vertical rack columns 112 on the first side 122 and the second side 124 of the rack 102. The rack enclosure 156 may include a top cover 158 attached to the upper frame 104 and a bottom cover 159 attached to the lower frame 106. The front side 128 may include an installed front door 160 and the rear side 130 may include an installed rear door 162. The installation of the rack panels 152, the top cover 158, the bottom cover 159, the front door 160, and the rear door 162 may form the rack enclosure 156.

The rack enclosure 156 may protect the chassis 132 and the computing components 134, as shown in FIG. 1A, from the environment. Further, the rack enclosure 156 may improve the circulation of the cooling air 148 by reducing or eliminating hot spots or irregular cooling of the components 134. The installation of the rack panels 152 to form the rack enclosure 156 may not hinder the cooling of the components 134 since the front perforations 126 are fully exposed, as shown in FIG. 1B.

Figure 1C:
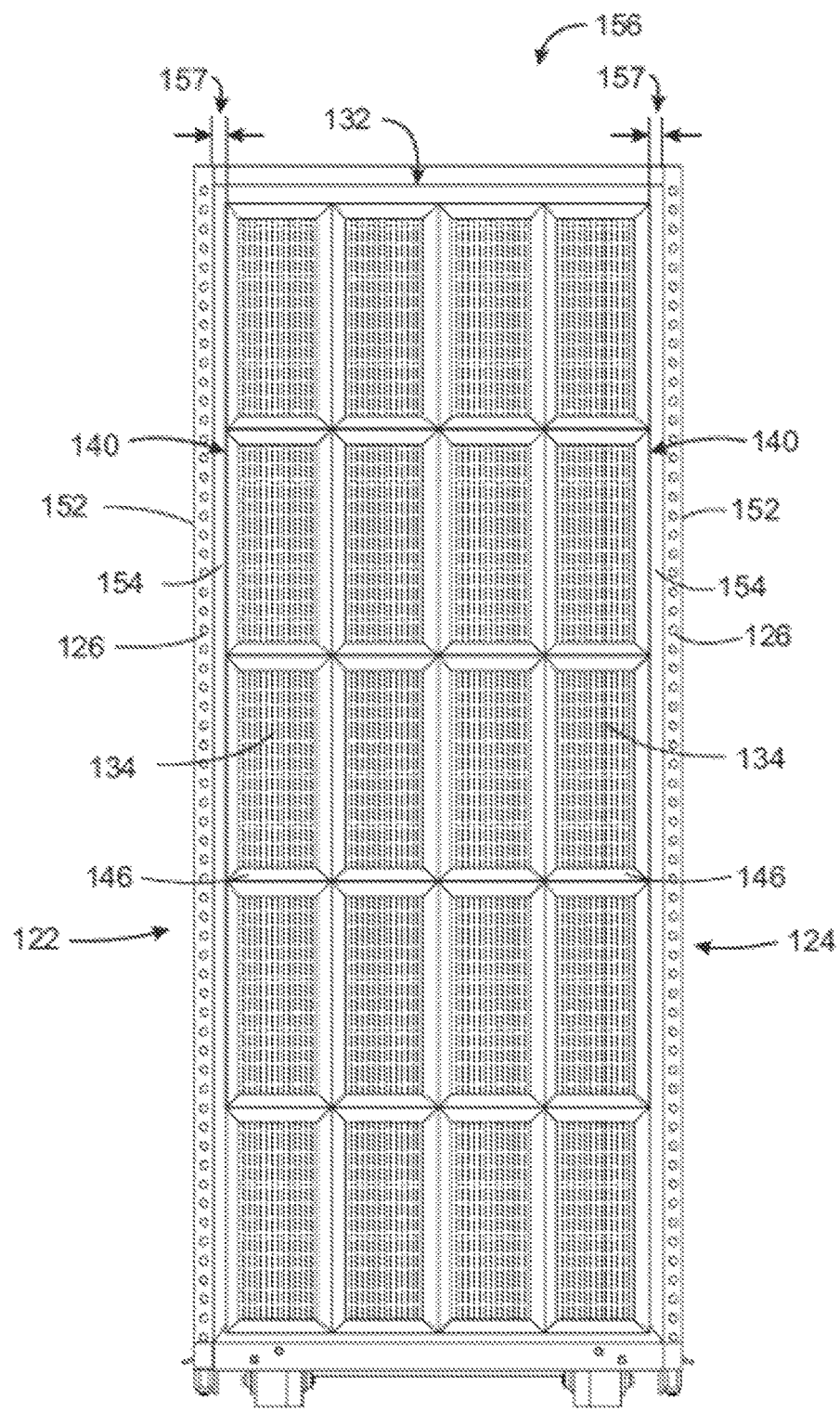
FIG. 1C is a front view of an example of the rack enclosure.

FIG. 1C is a front view of an example of the rack enclosure 156. Like numbered items are as described with respect to FIGS. 1A and 1B. The installation of the rack panels 152 may form the side plenums 154 on the first side 122 and the second side 124 of the rack enclosure 156. In particular, the side plenums 154 may include the internal space located between one rack panel 152 and the side surface 140 of the chassis 132 on the first side 122 and the second side 124. The cooling air 148, as shown in FIG. 1A, may enter the side plenums 154 through the front perforations 126. As a result, the side plenums 154 may consume less space within the rack enclosure 156 than in other designs.

For example, the width 157 of each side plenum 154 may be reduce from a range of about 0.5 inches to 1.0 inches on each side 122, 124 of the rack enclosure 156 to a range of about 0.1 inches to 0.2 inches on each side 122, 124. With the amount of space consumed by the side plenums 154 reduced, the chassis 132 may expand a substantial width of the rack enclosure 156. Consequently, the chassis 132 of the present examples may house additional computing components 134 to optimize performance, enhance productivity, among other advantages.

Figure 2:
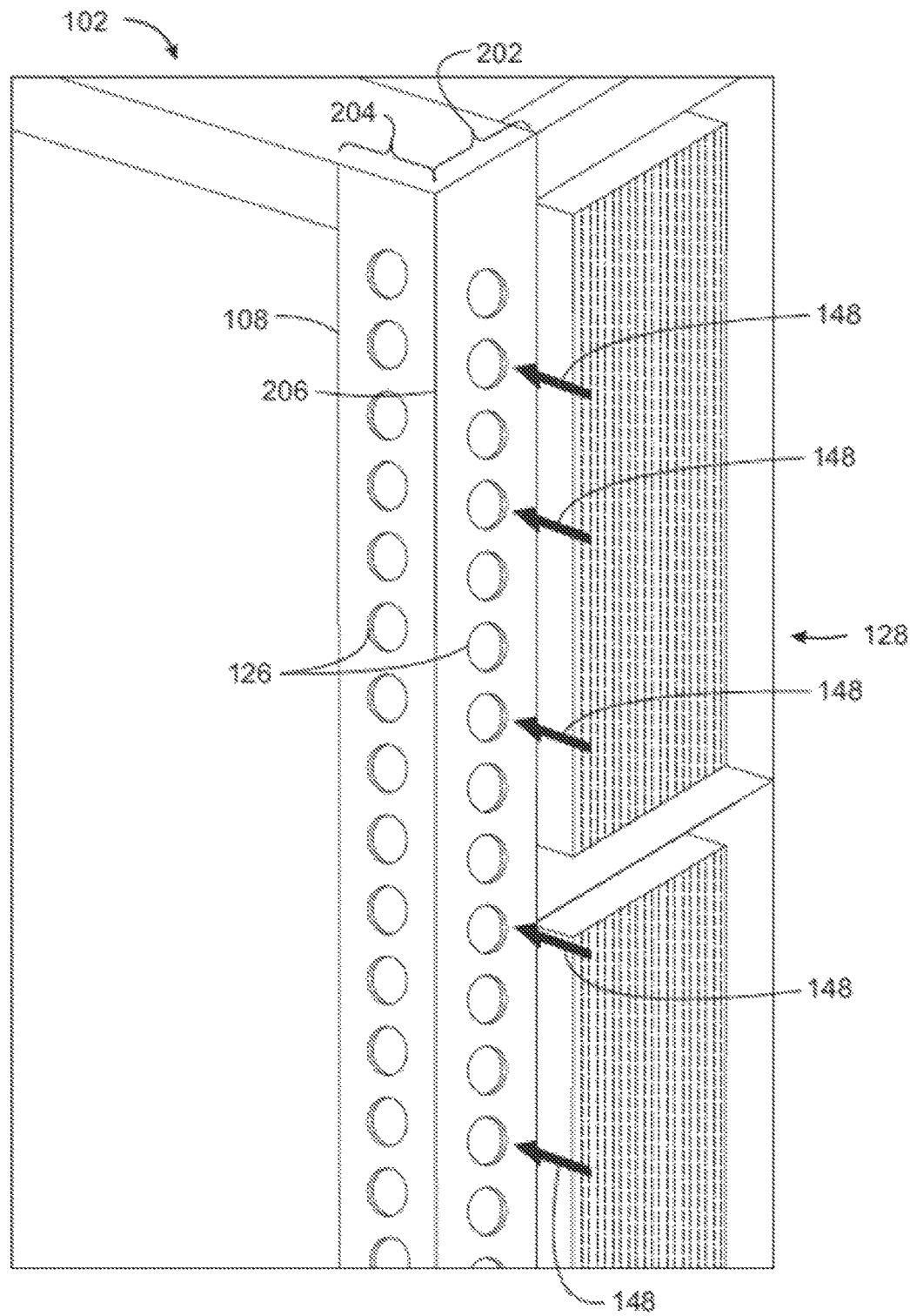
FIG. 2 is, a detailed perspective view of an example of front perforations formed in a front vertical rack column.

FIG. 2 is a detailed perspective view of an example of front perforations 126 formed in a front vertical rack column 108. Like numbered items are as described with respect to FIG. 1A. As shown in FIG. 2, the front vertical rack column 108 may include a front-face 202 and a front side-face 204 at the front side 128 of the rack 102. The front perforations 126 may extend along the vertical length of the front-face 202 and along the vertical length of the front side-face 204. The cooling air 148, as shown by the arrows, may enter the rack 102 at the front perforations 126 along the front-face 202 and the side-face 204. The front perforations 126 may allow the cooling air 148 to flow into the side plenums 154, as shown in FIG. 1A.

The front vertical rack column 108 may include a front edge 206 located between the front-face 202 and the side-face 204. As illustrated in FIG. 2, the edge 206 may include a 90° angle. In some examples, the edge 206 may be rounded to form, for example, a curved edge. Manufacturing specifications and techniques may specify the configuration of the edge 206.

The material of the rack 102, the chassis 132, and the rack panels 152 may include a durable metal material such as a commercial grade steel. A metal forming technique, for example, drilling, punching, or the like, may form the front perforations 126. The shape of the front perforations 126 may include a slot, a circle, a square, an oval, or any other shape to allow the cooling air 148 to flow into the rack 102. As illustrated in FIG. 2, the front perforations 126 may be equally spaced and of a similar diameter along the vertical length of the front vertical rack columns 108. In other examples, the front perforations 126 may be unequally spaced and of different diameters or any other configuration that may provide consistent cooling of the computing components 134 of FIG. 1A. The vertical length of the rack column 108 and the spacing between the perforations 126 may determine the number of perforations formed therein. Further, the number of computing components 134 located within the chassis 132 may determine the number of front perforations 126 needed to provide sufficient intake of the cooling air 148.

Figure 3:
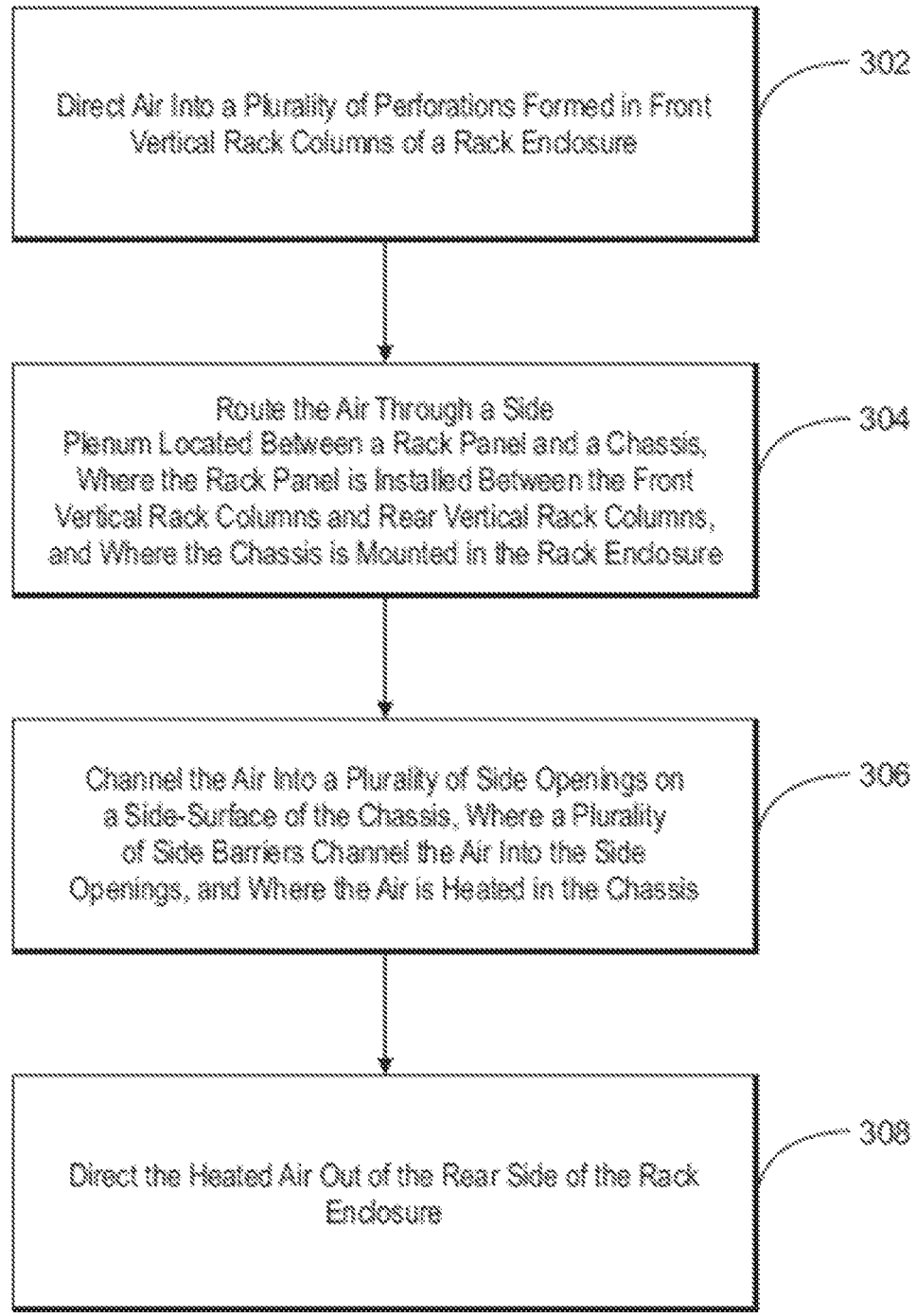
FIG. 3 is a block diagram of an example of a method for cooling heat generating computing components.

FIG. 3 is a block diagram of an example of a method for cooling heat generating computing components. A rack enclosure may include two front vertical rack columns and two rear vertical rack columns where a chassis may be mounted in the rack enclosure. The chassis may include a number of slots to house a number of heat generating computing components. A cooling system may maintain the temperature within the chassis in order to protect the computing components from excessive heat. In the present examples, the cooling system may include air at an ambient temperature. For example, the chassis may include internal fans to suction the air into the chassis to dissipate the heat. The air may initially flow through a number of front perforations formed within the front vertical rack columns. In particular, a front-face and a side-face of each of the front vertical rack columns may include the front perforations. At block 302, the air may be directed into the front perforations formed in each of the front vertical rack columns.

At block 304, the air may be routed through a side plenum. The side plenum may be formed between installed rack panels and the chassis to provide an air-pathway that extends along the side-surfaces of the chassis. The rack panels may be installed between the front vertical rack columns and rear vertical rack columns. The chassis may be mounted in the rack enclosure. The chassis may include a number of side openings located on its side-surfaces. At block 306, the air may be channeled into the side openings of the chassis. A number of side barriers may channel the air into the side openings. The air may flow over the computing components to remove the generated heat. In particular, the heat generated by the computing components may be transferred to the air to generate a heated air in the chassis. At block 308, the heated air may be directed out of the chassis and out of the rear side of the rack enclosure. For example, the heated air may exit a perforated rear door located at the rear side of the rack enclosure. In some examples, the air may flow into the rack enclosure in a front-to-back pattern or a side-to-side pattern.

Figure 4:
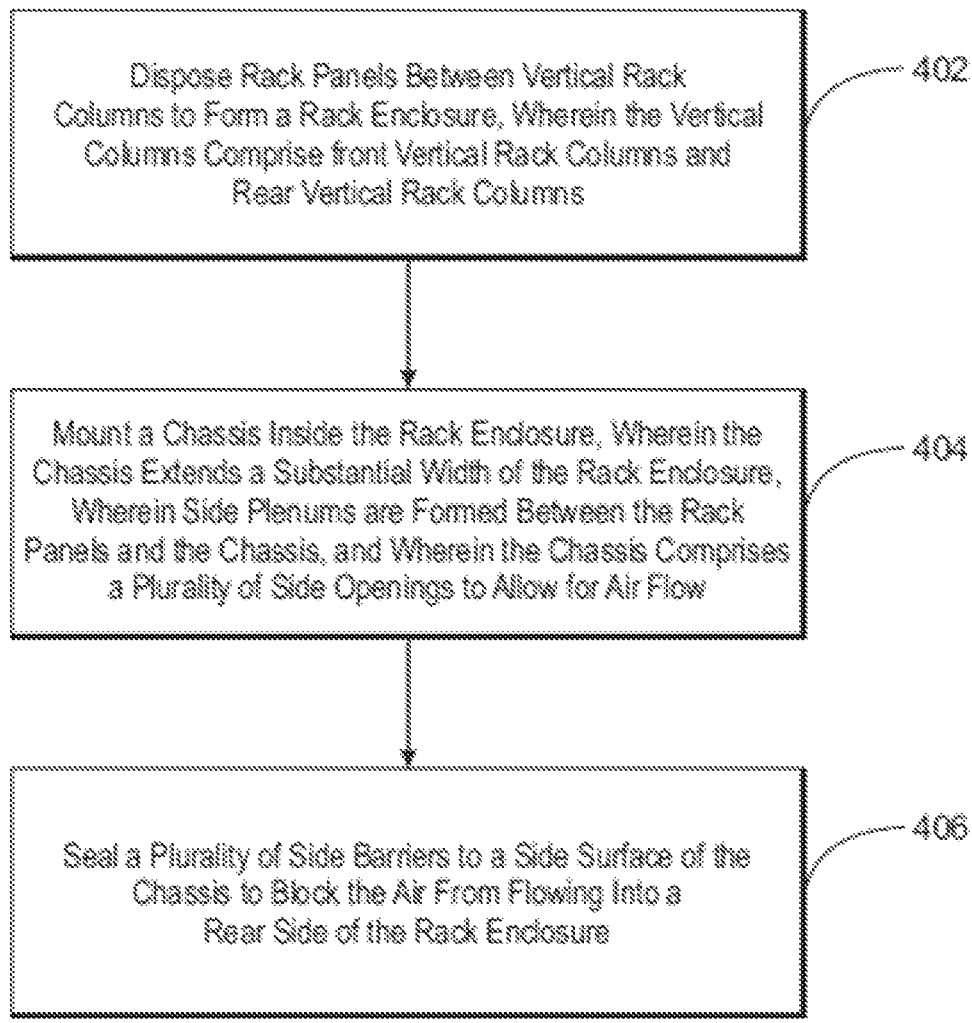
FIG. 4 is a block diagram of an example of a method for forming a rack enclosure to channel air through side plenums and into side openings of a chassis.

FIG. 4 is a block diagram of an example of a method for forming a rack enclosure to channel air through side plenums and into side openings of a chassis. At block 402, a rack may include rack panels installed between vertical rack columns to form a rack enclosure. The vertical rack columns may include front vertical rack columns and rear vertical rack columns. At block 404, a chassis may be mounted in the rack enclosure to extend a substantial width of the rack enclosure. The chassis may house a maximum number of computing components. With the mounting of the chassis, side plenums may be formed between the rack panels and the chassis. A number of side openings of the chassis make provide for the intake of air into the chassis. At block 406, a number of side barriers may be sealed to side surfaces of the chassis to block the air from flowing into a rear side of the rack enclosure and to divert the air into the side openings of the chassis. The air may flow into the chassis to remove neat generated by the computing components.

While the present techniques may be susceptible to various modifications and alternative forms, the embodiments discussed above have been shown only by way of example. However, it should again be understood that the techniques is not intended to be limited to the particular embodiments disclosed herein. Indeed, the present techniques include all alternatives, modifications, and equivalents falling within the true spirit and scope of the appended claims.

What is claimed is:

1. A rack enclosure, comprising:
a rack comprising vertical rack columns, including
a front vertical rack column, and
rack panels;
perforations formed in the front vertical rack column,
a chassis mounted in the rack, the chassis housing heat-producing components, the chassis having a side surface with openings therein;
a vertical barrier extending between the side surface of the chassis and one of the rack panels;
a side plenum bounded by the side surface of the chassis, one of the rack panels, the vertical barrier, and the front vertical rack column such that, when air flows: from outside the rack enclosure into the front vertical rack column via the perforations; from the front vertical rack column into the side plenum; and from the side plenum into the chassis via the openings in the chassis.

2. The rack enclosure of claim 1, wherein the side plenums comprise a space between the side surface of the chassis and one of the rack panels, wherein the width of the space is 0.1 inches to 0.2 inches.

3. The rack enclosure of claim 1, wherein the vertical barrier prevents a mixing of the air in the side plenums with heated air exhausted from the chassis.

4. The rack enclosure of claim 1, wherein the vertical barrier blocks heated air exhausted from the chassis from flowing into the plurality of openings.

5. A method of cooling heat-producing components, comprising:
causing air to flow from outside a rack enclosure into a front vertical rack column of a rack of the rack enclosure via perforations formed in the front vertical rack column, causing the air to flow from the front vertical rack column into a side plenum of the rack enclosure the side plenum being bounded by a side surface of a chassis mounted in the rack, a side panel of the rack, a vertical barrier extending between the side surface of the chassis and the side panel of the rack, and the front vertical rack column:

causing the air to flow from the side plenum into the chassis via openings in the side surface of the chassis: and causing the air to be exhausted from a rear of the chassis after being heated in the chassis.

6. The method of claim 5, wherein the perforations are on a front-face and a side-face of the front vertical rack column.

7. The method of claim 5, wherein a width of the plenum space between the side rack panel and the chassis is 0.1 inches to 0.2 inches.

8. A method comprising:

providing a rack comprising rack panels including a side rack panel and vertical rack columns including a front vertical rack column comprising perforations;

mounting a chassis inside the rack such that there is a plenum space between the side rack panel and a side surface of the chassis, wherein the side surface of the chassis comprises openings to allow for air flow into the chassis; and sealing a vertical barrier between the side rack panel and the side surface of the chassis such that air is directed to flow:

from outside the rack into the front vertical rack column via the perforations;

from the front vertical rack column into the plenum space; and from the plenum space into the chassis via the openings in the side chassis;

wherein the vertical barrier inhibits communication of air between the plenum space and a rear side of the rack enclosure.

* * * * *